United States Patent
Mimura et al.

[11] Patent Number: 6,127,210
[45] Date of Patent: Oct. 3, 2000

[54] MANUFACTURING METHOD OF CMOS THIN FILM SEMICONDUCTOR DEVICE AND CMOS THIN FILM SEMICONDUCTOR DEVICE MANUFACTURED THEREBY

[75] Inventors: Akio Mimura, Hitachinaka; Hiroshi Suga, Tokai-mura; Masaichi Nagai; Youmei Shinagawa, both of Hitachi; Isao Ikuta, Iwaki, all of Japan

[73] Assignee: Hitachi, Ltd., Tokyo, Japan

[21] Appl. No.: 08/724,834

[22] Filed: Oct. 3, 1996

[30] Foreign Application Priority Data

Oct. 16, 1995 [JP] Japan .................................. 7-266684

[51] Int. Cl.[7] ............................................. H01L 21/00
[52] U.S. Cl. ......................... 438/153; 438/163; 438/231
[58] Field of Search ........................... 438/153, 154, 438/163, 231, 232, FOR 155, FOR 183, FOR 184, FOR 200, FOR 201, FOR 168, FOR 216, FOR 217; 257/59, 57, 66, 72, 69, 351

[56] References Cited

U.S. PATENT DOCUMENTS

| | | |
|---|---|---|
| 4,217,153 | 8/1980 | Fukunaga et al. . |
| 4,507,846 | 4/1985 | Ohno . |
| 4,902,638 | 2/1990 | Muto . |
| 5,064,775 | 11/1991 | Chang ........................................ 437/40 |
| 5,316,960 | 5/1994 | Watanabe et al. ....................... 438/154 |
| 5,341,012 | 8/1994 | Misawa et al. .......................... 438/154 |
| 5,563,427 | 10/1996 | Yudasaka et al. ....................... 438/154 |
| 5,650,338 | 7/1997 | Yamazaki et al. ...................... 438/154 |

FOREIGN PATENT DOCUMENTS 2-292858 12/1990 Japan .
4-38865 2/1992 Japan .

OTHER PUBLICATIONS

Hong et al., Material and Electrical Properties of Ultra–Shallow p+–n Junctions formed by low–energy ion implantation and rapid thermal annealing, (IEEE), pp 476–486, 1991.

"Low–Temperature Poly–Si TFT Process Technology for Large Glass Substrate", A. Mimura, Y. Mikami, K. Kuwabara, Y. Mori, M. Nagai, Y. Nagae, E. Kaneko, Hitachi Research Laboratory, Hitachi, Ltd., pp. 126–129.

H. Ohshima, et al. "Full–Color LCDs with Completely Integrated Drivers Utilizing Low–Temperature Poly–Si TFTs" (SID 93 DIGST, pp. 387–390).

*Primary Examiner*—Charles Bowers
*Assistant Examiner*—Scott J. Hawranek
*Attorney, Agent, or Firm*—Antonelli, Terry, Stout & Kraus, LLP

[57] ABSTRACT

A simple and convenient method of manufacturing a CMOS TFT semiconductor circuit device wherein a doping layer doped into a first conductivity type without a mask is compensated with a dopant of a second conductivity type having a high density so that the conductivity type of the doping layer of first conductivity type is inverted into the second conductivity type, and further, in order to carry out the inversion of the conductivity type by the compensation easily and reliably, the surface density of the dopant of the doping layer of first conductivity type is reduced prior to compensating with the dopant of second conductivity type.

13 Claims, 9 Drawing Sheets

FIG. 2A
N CHANNEL

FIG. 2B
P CHANNEL

FIG. 2C
N CHANNEL

FIG. 2D
P CHANNEL

FIG. 5A
N CHANNEL

FIG. 5B
P CHANNEL

FIG. 5C
N CHANNEL

FIG. 5D
P CHANNEL

FIG. 5E
N CHANNEL

FIG. 5F
P CHANNEL

MANUFACTURING METHOD OF CMOS THIN FILM SEMICONDUCTOR DEVICE AND CMOS THIN FILM SEMICONDUCTOR DEVICE MANUFACTURED THEREBY

BACKGROUND OF THE INVENTION

The present invention relates to a method of manufacturing a CMOS thin film semiconductor device of the type used for a thin film transistor (TFT) type liquid crystal display (LCD), and to a CMOS thin film semiconductor device manufactured thereby.

In TFT-LCDs, a polycrystalline silicon (p-Si) TFT which is formed on a quartz substrate, or an amorphous silicon (a-Si) TFT which is formed on a large size glass substrate, is mostly used. The TFTs in the TFT-LCDs are used in one instance for a TFT matrix in a display portion and in another instance for formation of an outer circumferential circuit on a common substrate for driving such a TFT matrix. In the former instance, an n channel TFT is used, and in the latter instance, a CMOS TFT semiconductor circuit is used for achieving high speed operation.

In order to produce a CMOS TFT semiconductor circuit, it is necessary to form an n channel TFT in which an n type dopant is doped and a p channel TFT in which a p type dopant is doped. A method of forming such CMOS TFT semiconductor circuit is fundamentally based on manufacturing processes of an LSI semiconductor device. Namely, the doping treatments are performed in separate processes while alternatively protecting an n type dopant and a p type dopant with masks.

A conventional method will be explained with reference to FIGS. 9A through 9D which illustrate subject matter disclosed by H. Ohshima et al. "Full-Color LCDs with Completely Integrated Drivers Utilizing Low-Temperature Poly-Si TFTs" in Conference Record of Society for Information Display, pp387–390(1993).

Figure 9A:
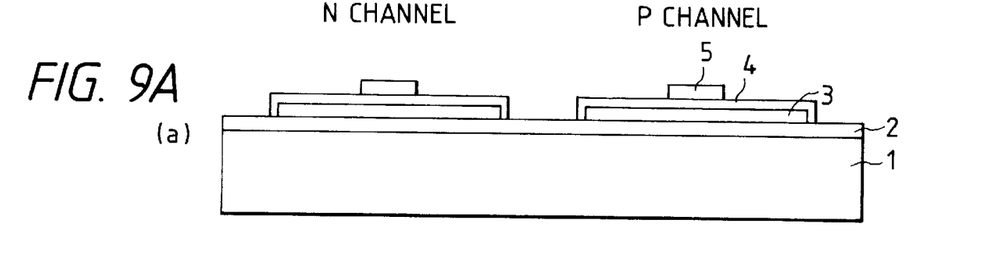
FIGS. 9A through 9D are diagrams for explaining a conventional method of manufacturing a coplanar type CMOS TFT.

FIG. 9A relates to process (a) and shows a cross sectional view of a coplanar type TFT forming a base body. A backing film 2 consisting of $SiO_2$ is formed on a glass substrate 1. An active layer silicon film 3 is formed on the backing film 2 and the crystalline quality of the active layer silicon film 3 is improved, such as by laser crystallization and thermal crystallization. On the active layer silicon film 3 a gate insulation film 4 consisting of $SiO_2$ is formed. Further, a gate electrode 5 consisting of a metal or silicon film, for example is formed on the gate insulation film 4 and is processed so as to work as a gate.

Figure 9B:
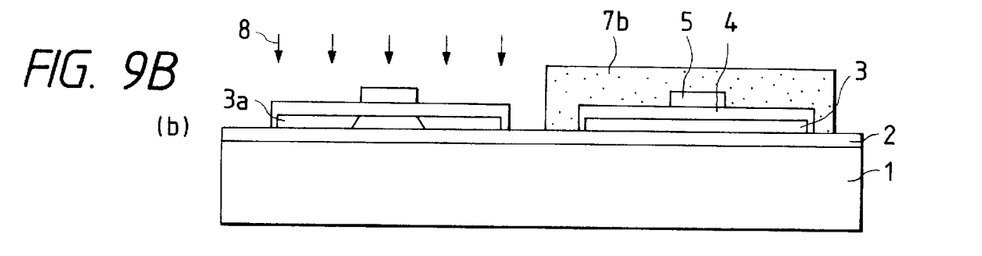

In process (b) shown in FIG. 9B, a dope mask 7b is formed for the TFT on the p channel side and a phosphorus ion beam 8 is irradiated onto the TFT on the n channel side to form a source-drain layer 3a. For the irradiation by the phosphorus ion beam 8, an ion doping method suitable for a large scale substrate which performs no mass separation is used instead of using an ion injector as customary used in an LSI manufacturing process. An acceleration voltage of about 100 keV for the phosphorous ion beam irradiation is necessary because the phosphorous ions have to be accelerated to penetrate through the gate insulation 5. With such high acceleration voltage, ion energy is increased and the temperature of the substrate is raised because of a poor thermal conductivity of the glass. For this reason a heat resistant material, such as polyimide, is used for the dope mask 7b, but further measures for reducing the thermal load are necessary, such as by reducing the ion density and by prolonging the doping time.

Figure 9C:
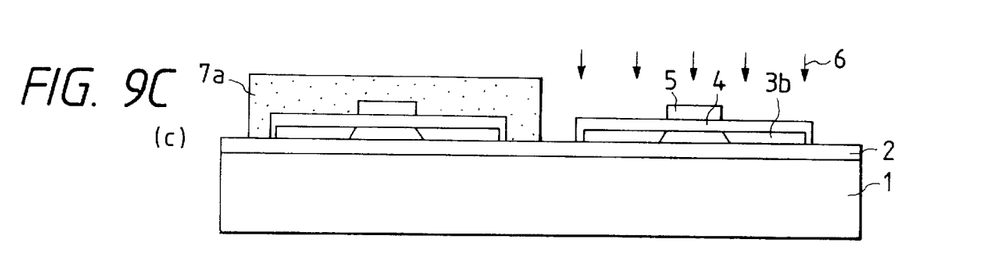

In process (c) as shown in FIG. 9C, a dope mask 7a is formed on the TFT on the n channel side and a boron ion beam 6 is irradiated onto the TFT on the p channel side to form a source-drain layer 3b.

Figure 9D:
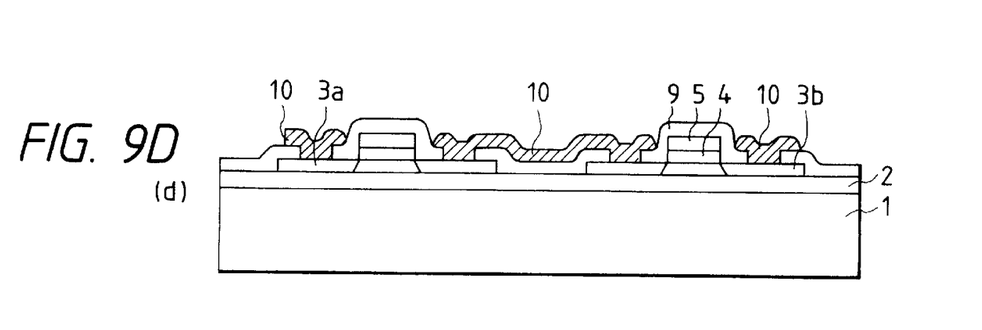

In process (d) as shown in FIG. 9D, the source-drain layers 3a and 3b are activated, such as by heat treatment and laser beam heating. Further, a protective insulation layer 9 consisting of $SiO_2$, for example is formed, and after forming contact holes, source-drain electrodes 10 are formed to complate the element. By connecting the source-drains of the p and n channel TFTs as illustrated, an inverter constituting a base unit of a circuit element is formed.

SUMMARY OF THE INVENTION

For a simple TFT semiconductor circuit device, a simple manufacturing process which requires a smaller number of masking times than an LSI semiconductor manufacturing process is required. Thereby, an object of the present invention is to provide a simple and convenient method of manufacturing a CMOS TFT semiconductor circuit device and to provide a CMOS TFT semiconductor circuit device manufactured thereby.

In a method of manufacture of a CMOS TFT semiconductor circuit device according to the present invention, a doping layer of first conductivity type is doped without a mask and then compensated by a dopant of a second conductivity type having a higher density, thereby the conductivity type of the doping layer of first conductivity type is inverted to produce a doping layer of second conductivity type.

Further, in order to carry out easily and reliably the inversion of the conductivity type through the above compensation, the surface dopant density of the doping layer of first conductivity type is reduced before effecting the compensation by the dopant of second conductivity type.

Through the inverting operation of the conductivity type by the compensation, a region of the opposite conductivity type can be formed while reducing the mask doping process, so that the method of manufacture of the CMOS TFT semiconductor circuit device is simplified.

DETAILED EXPLANATION OF PREFERRED EMBODIMENTS

An embodiment according to the present invention will be explained with reference to FIGS. 1A through 1D.

Figure 1A:
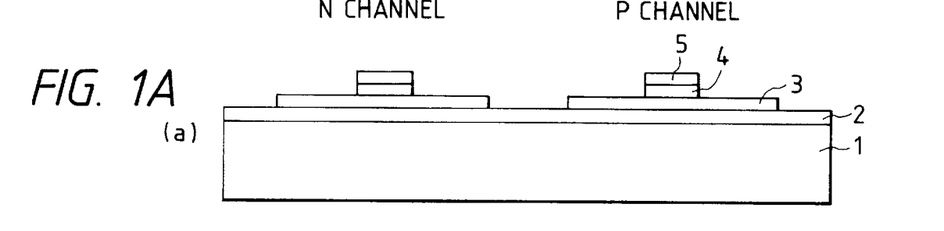
FIGS. 1A through 1D are diagrams for explaining a method of manufacturing a coplanar type CMOS TFT according to the present invention.

FIG. 1A relates to process (a) and is a cross sectional view of a coplanar type TFT forming a base body. A backing film 2 consisting of $SiO_2$ is formed on a glass substrate 1. An active layer silicon film 3 is formed on the backing film 2 and the crystalline quality of the active layer silicon film 3 is improved, such as by laser crystallization and thermal crystallization. On the active layer silicon film 3 a gate insulation film 4 consisting of $SiO_2$ is formed. Further, a gate electrode 5 consisting of a silicon film is formed on the gate insulation film 4 and is processed so as to work as a gate.

Figure 1B:
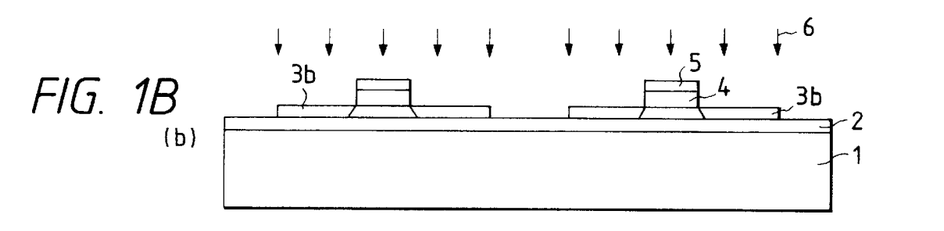

In process (b) shown in FIG. 1B, boron ion beam 6 is irradiated onto the substrate to form source-drain layers 3b. For the irradiation of the boron ion beam 6, an ion doping method is used which effects no mass separation. The doping operation is performed for about 10 seconds with an acceleration voltage from 3 keV to 7 keV using 1% diborane gas at ion density of 0.5 mA/cm².

Figure 1C:
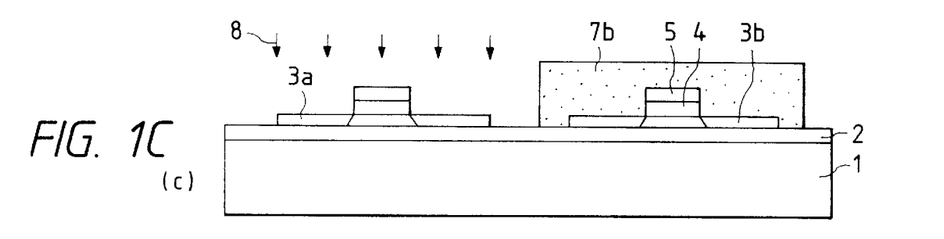

In process (c) shown in FIG. 1C, a resist doping mask 7b is formed on a TFT on the p channel side and a phosphorus ion beam 8 is irradiated onto a TFT on the n channel side to form a source-drain layer 3a. The irradiation conditions are substantially the same as in process (b) except that the irradiation time is prolonged to 30~60 seconds so as to increase the density of the phosphorus. Because of the low acceleration voltage and the corresponding low ion energy, a customary resist can be used as a mask.

Figure 2A:
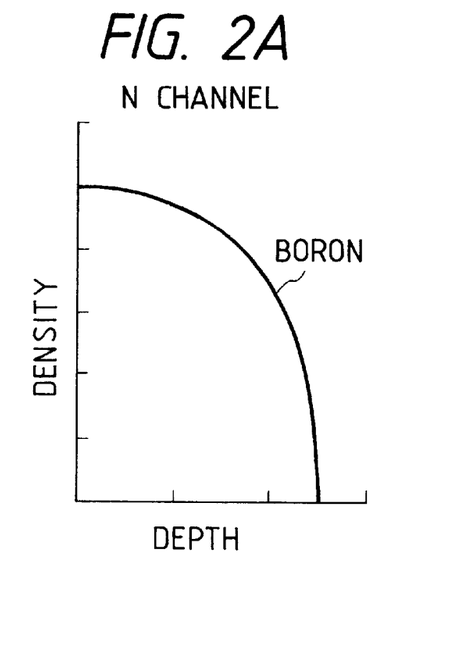
FIGS. 2A through 2D are density distribution diagrams for boron and phosphorus in the manufacturing processes in FIGS. 1B and 1C.
Figure 2B:
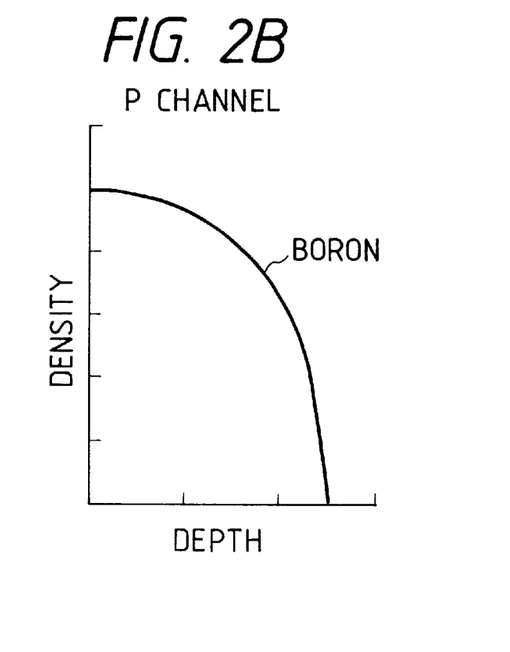
Figure 2C:
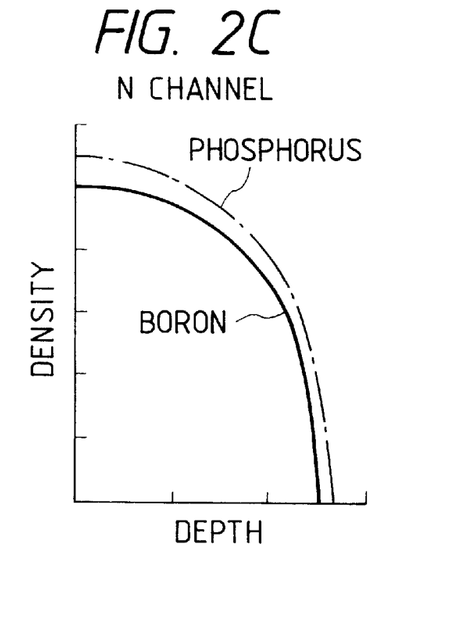
Figure 2D:
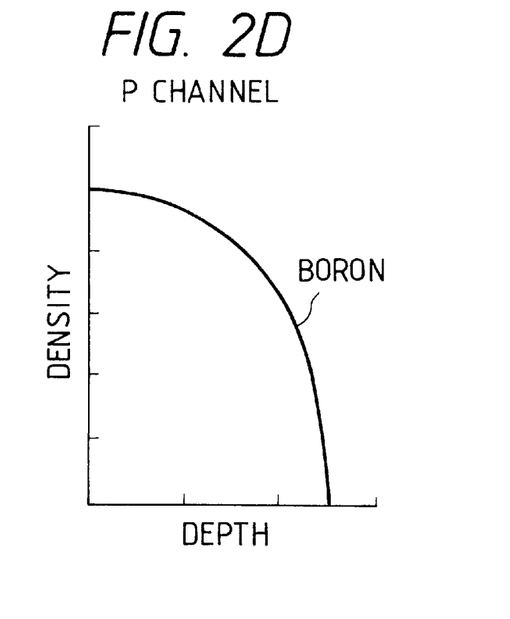

FIGS. 2A through 2D show density distributions of boron and phosphorus in the depth direction of the coplanar type TFT. FIGS. 2A and 2B show density distributions of boron and phosphorus in the process (b) as shown in FIG. 1B and FIGS. 2C and 2D show density distributions of boron and phosphorus in the process (c) as shown in FIG. 1C. As shown in FIG. 2C, the conductivity type of the layer is changed to the opposite conductivity type by increasing the density of phosphorus, whereby the conductivity type of the doping layer in the n channel TFT is inverted to form an n type source-drain layer 3a, and in the p channel TFT, the original p type source-drain layer 3b remains.

Figure 1D:
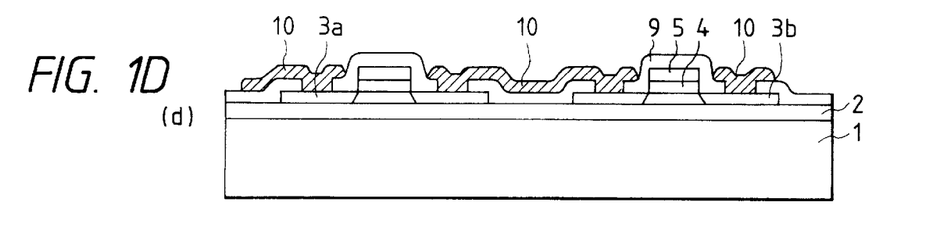

In process (d) shown in FIG. 1D, the source-drain layers 3a and 3b are activated, such as by heat treatment and laser beam heating. Further, a protective insulation layer 9 consisting of $SiO_2$, for example is formed, and after forming contact holes, source-drain electrodes 10 are formed to complete an inverter constituting a base unit of the circuit element. Further, the active layer silicon film 3 can be p-Si or a-Si.

FIGS. 3A through 3D show another embodiment according to the present invention. The manufacturing method of the present embodiment is substantially the same as in the embodiment explained in connection with FIGS. 1A through 1D except that the order of the doping operations of phosphorus and boron is reversed.

Figure 3A:
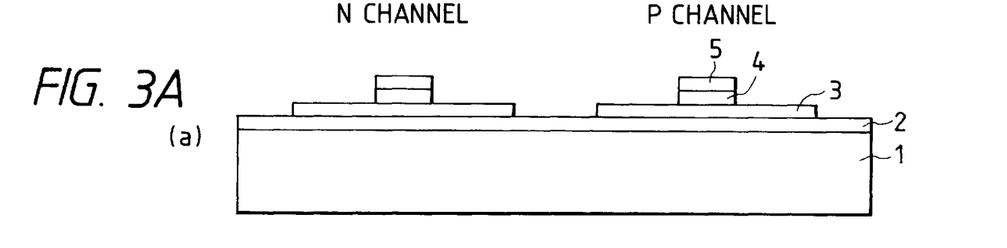
FIGS. 3A through 3D are diagrams for explaining another method of manufacturing a coplanar type CMOS TFT according to the present invention.
Figure 3B:
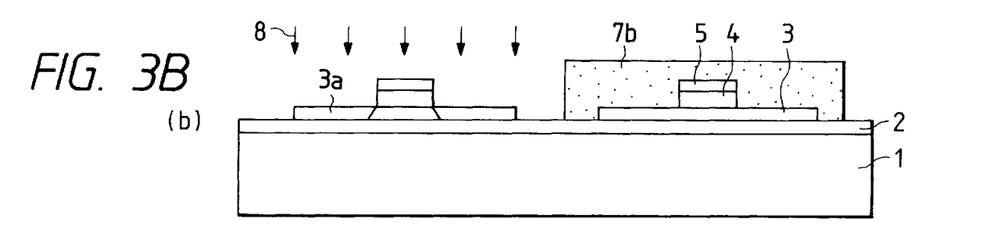
Figure 3C:
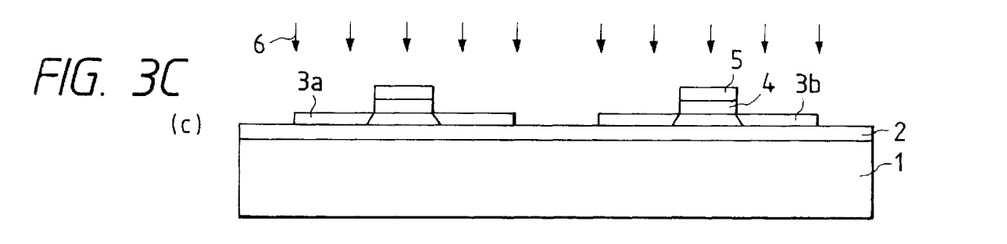
Figure 3D:
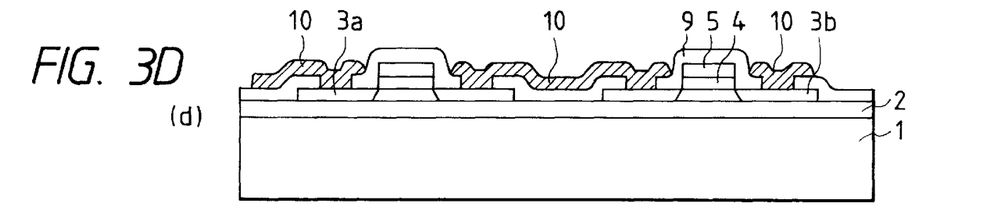

In process (b) shown in FIG. 3B, phosphorus of high density is at first doped into the n channel region while using the resist doping mask 7b, and in the process (c) shown in FIG. 3C, boron of a low density is doped over the entire surface. In the n channel region the doped boron is compensated by the phosphorus, thereby, an n channel is formed therein. With the present method, a CMOS element also can be produced through a single masking operation.

FIGS. 4A through 4E show still another embodiment according to the present invention. The manufacturing method of the present embodiment is substantially the same as in the embodiment explained in connection with FIGS. 1A through 1D, except that the acceleration voltages for phosphorus and boron doping are modified in order to carry out the conductivity type inverting operation more easily and reliably.

Figure 4A:
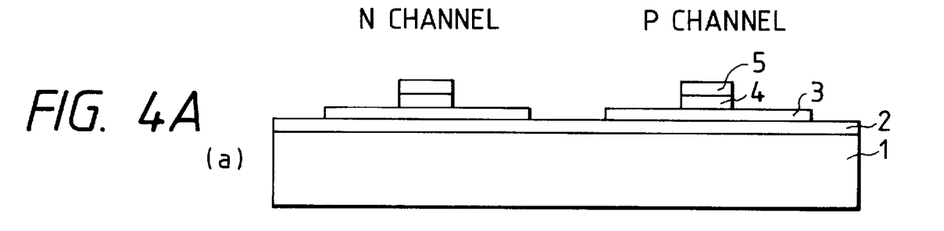
FIGS. 4A through 4E are diagrams for explaining still another method of manufacturing a coplanar type CMOS TFT according to the present invention.
Figure 4B:
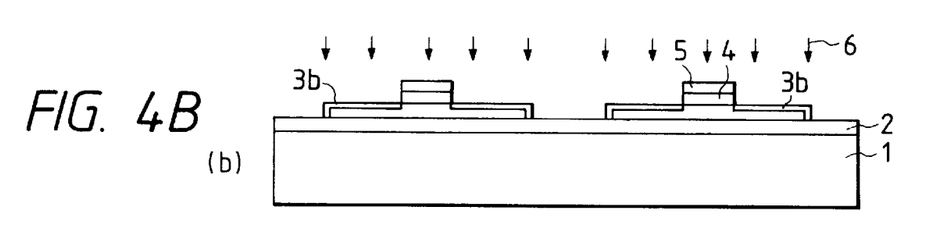

In process (b) shown in FIG. 4B, boron ion beam 6 is irradiated onto the substrate to form source-drain layers 3b. For the irradiation of the boron ion beam 6, an ion doping method is used which effects no mass separation. The doping operation is performed for about 10~30 seconds with an acceleration voltage from 500 eV to 3 keV using 1% diborane gas at an ion density of 0.5 mA/cm². The features of the present embodiment, in comparison with the embodiment shown in FIGS. 1A through 1D are that the acceleration voltage is low and the source-drain layer 3b is shallow.

Figure 4C:
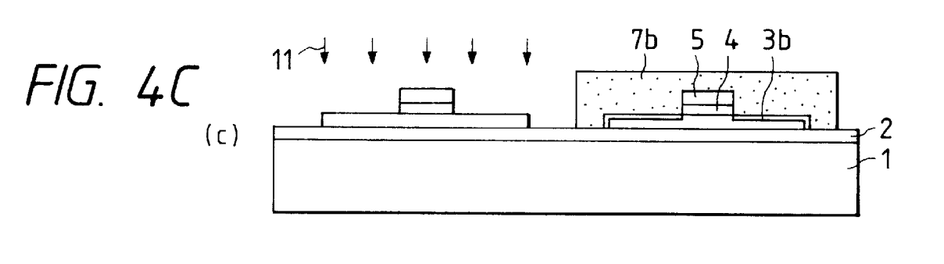

In the process (c) shown in FIG. 4C, a resist doping mask 7b is formed on the TFT on the p channel side. Thereafter, an oxygen ion beam 11 is irradiated by a reactive ion ashing, thereby, the high density boron layer on the surface of the shallow source-drain layer 3b is removed.

Figure 4D:
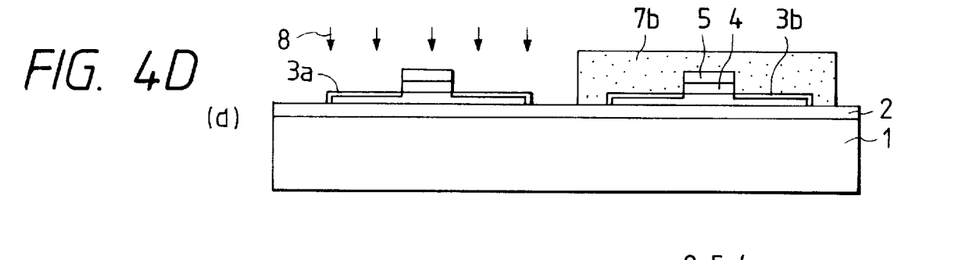

In the process (d) shown in FIG. 4D, the phosphorus ion beam 8 is irradiated onto the TFT on the n channel side to form the source-drain layer 3a in the same manner as in the process (c) in FIG. 1C. The irradiation conditions are substantially the same as in the process (c) in FIG. 1C, however, if the irradiation time is prolonged to about 10~30 seconds as in the above process (b), the conductivity type can be sufficiently inverted because of the lower surface density of boron.

Figure 5A:
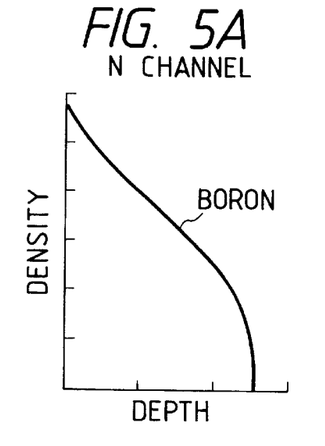
FIGS. 5A through 5F are density distribution diagrams for boron and phosphorus in the manufacturing processes in FIGS. 4B, 4C and 4D.
Figure 5B:
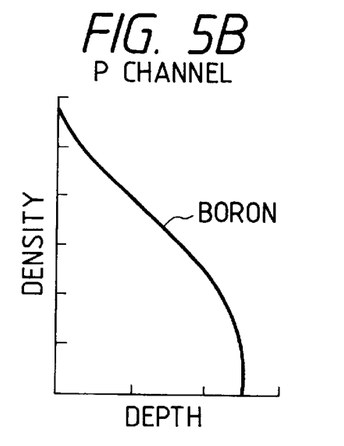
Figure 5C:
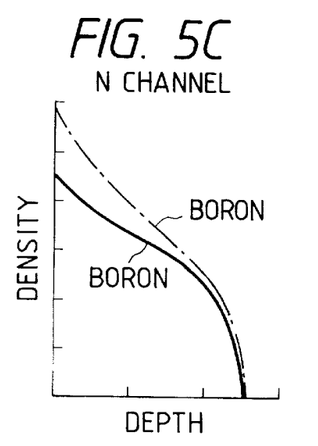
Figure 5D:
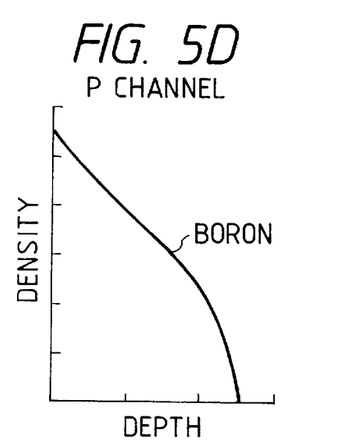
Figure 5E:
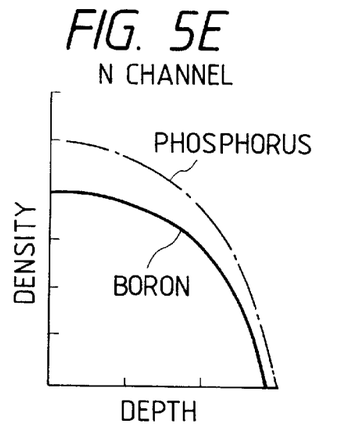
Figure 5F:
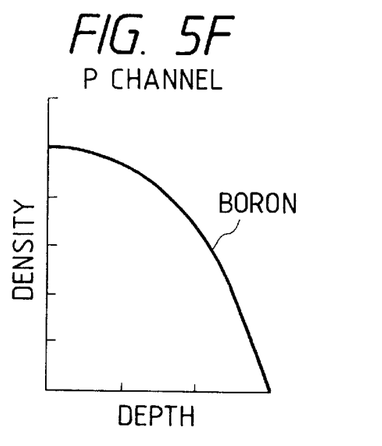

FIGS. 5A through 5F show the density distributions of boron and phosphorus in the depth direction of the coplanar type TFT manufactured according to the method shown in FIGS. 4A through 4D. FIGS. 5A and 5B show the density distributions of boron in the process (b) shown in FIG. 4B, FIGS. 5C and 5D show the density distributions of boron in the process (c) shown in FIG. 4C, and FIGS. 5E and 5F show the density distributions of boron and phosphorus in the process (d) shown in FIG. 4D. As shown in FIGS. 5C and 5E, through the oxygen ion beam treatment, the surface density of boron is reduced, thereby the inversion of the conductivity type can be easily effected.

Figure 4E:
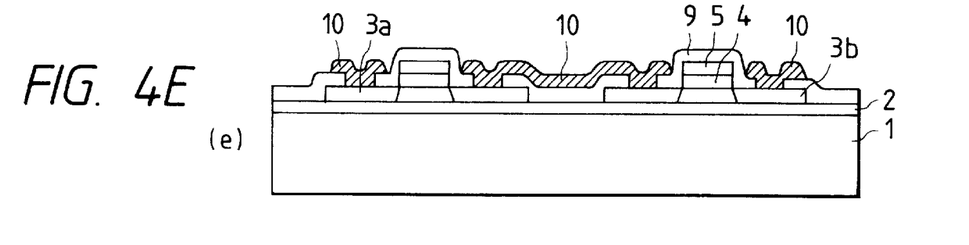

In the process (e) shown in FIG. 4E, substantially the same element as in the previous embodiment can be obtained. Further, in place of the oxygen ion beam 11 by the irradiation of reactive ion ashing another treatment, by inert gas or active gas having low energy is also effective.

FIGS. 6A through 6D show a further embodiment of the present invention which is applied to an inverted stagger channel etching type TFT. In the present embodiment, after forming the gate electrodes 5, the gate insulation films 4 and the active layer silicon film 3, the doping operation is performed in substantially the same manner as in the embodiment shown in connection with FIGS. 4B through 4E.

Figure 6A:
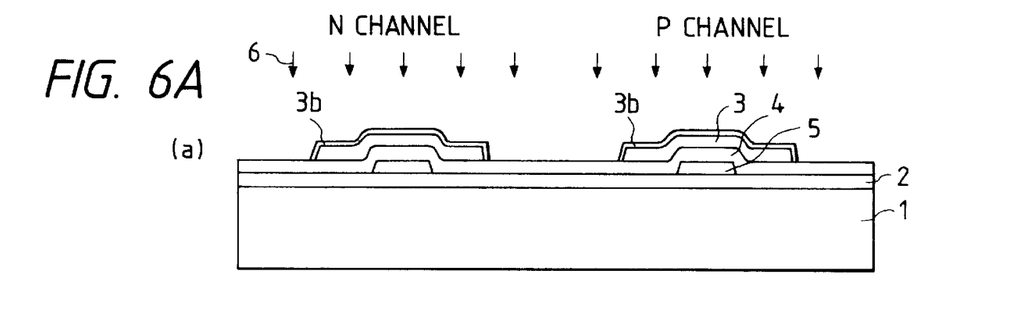
FIGS. 6A through 6D are diagrams for explaining a method of manufacturing an inverted stagger channel etching type CMOS TFT according to the present invention.

In the process (a) shown in FIG. 6A, a boron ion beam 6 is irradiated over the entire surface of the substrate to form a shallow source-drain layer 3b.

Figure 6B:
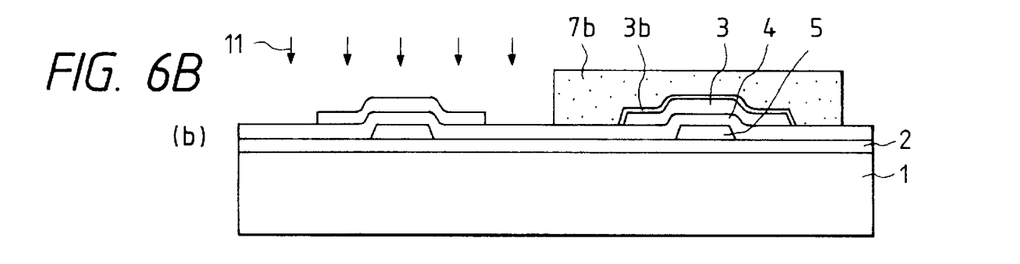

In the process (b) shown in FIG. 6B, a resist doping mask 7b is formed on the TFT on the p channel side. Thereafter, an oxygen ion beam 11 is irradiated by a reactive ion ashing, thereby, the high density boron layer on the surface of the shallow source-drain layer 3b is removed.

Figure 6C:
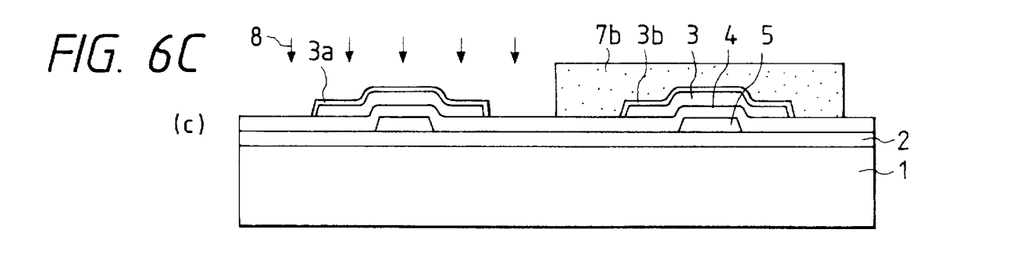

In the process (c) shown in FIG. 6C, the phosphorus ion beam 8 is irradiated onto the TFT on the n channel side to form the source-drain layer 3a in the same manner in the process (c) in FIG. 4D.

Figure 6D:
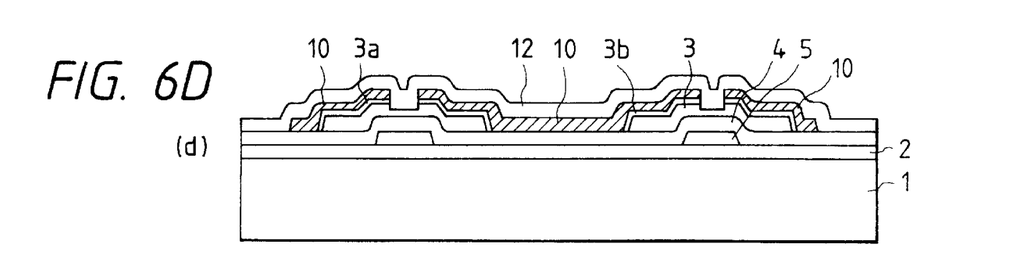

In the process (d) as shown in FIG. 6D, after forming the source-drain electrodes 10 and etching the back face channel, a surface protective film 12 consisting of SiN, for example is formed to complete an inverter constituting a base unit of the circuit element. Further, the active layer silicon film 3 can be p-Si or a-Si.

FIGS. 7A through 7D show a still further embodiment of the present invention which is applied to an inverted stagger channel protective type TFT. In the present embodiment, after forming the gate electrodes 5, the gate insulation films 4, the active layer silicon film 3 and a channel protective film 13, the doping operation is performed in substantially the same manner as in the embodiment shown in connection with FIGS. 6A through 6D.

Figure 7A:
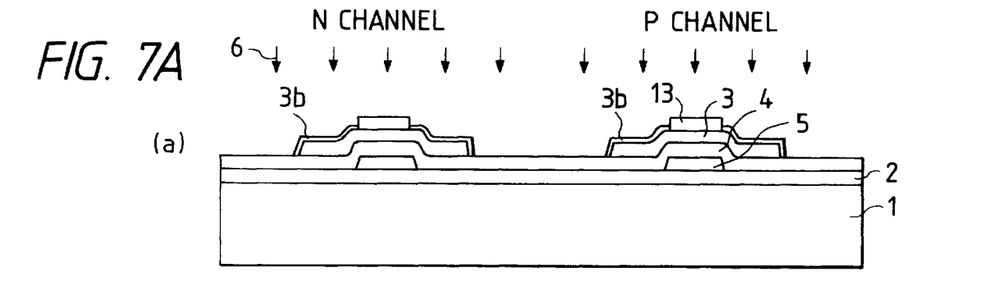
FIGS. 7A through 7D diagrams for explaining a method of manufacturing an inverted stagger channel protection type CMOS TFT according to the present invention.

In the process (a) shown in FIG. 7A, a boron ion beam 6 is irradiated over the entire surface of the substrate to form a shallow source-drain layer 3b.

Figure 7B:
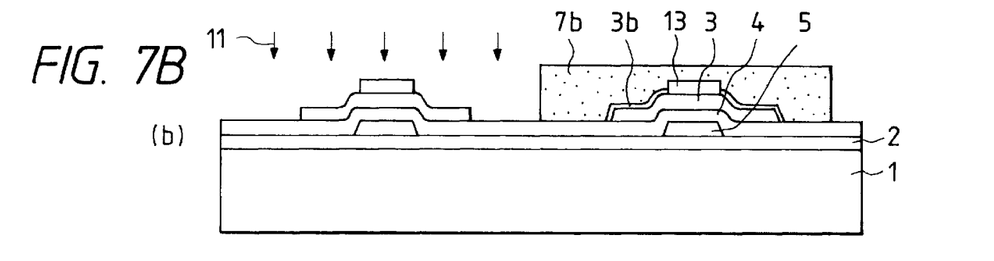

In the process (b) shown in FIG. 7B, a resist doping mask 7b is formed on the TFT on the p channel side. Thereafter, an oxygen ion beam 11 is irradiated by a reactive ion ashing, thereby, the high density boron layer on the surface of the shallow source-drain layer 3b is removed.

Figure 7C:
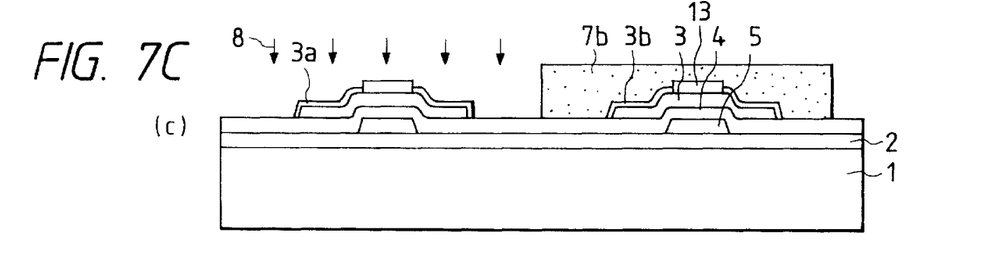

In the process (c) shown in FIG. 7C, the phosphorus ion beam 8 is irradiated onto the TFT on the n channel side to form the source-drain layer 3a in the same manner as in the process (c) in FIG. 4D.

Figure 7D:
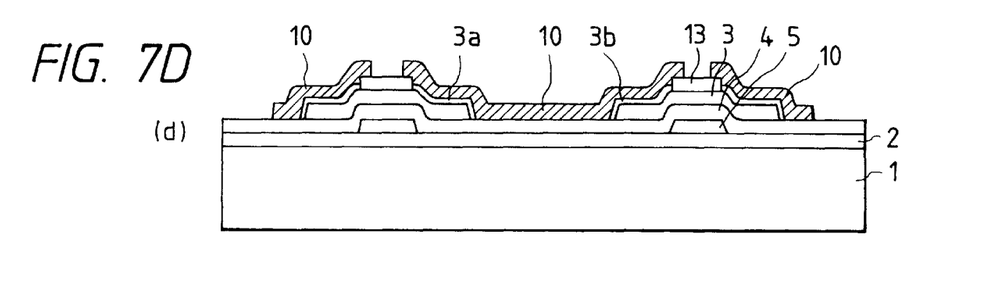

In the process (d) shown in FIG. 7D, after forming the source-drain electrodes 10, an inverter constituting a base unit of the circuit element is completed.

FIGS. 8A through 8D show a still further embodiment of the present invention which is applied to a normal stagger type TFT. In the present embodiment, after forming source-drain electrodes 10a and 10b, the doping operation is performed in substantially the same manner as in the embodiment shown in connection with FIGS. 1B through 1C.

Figure 8A:
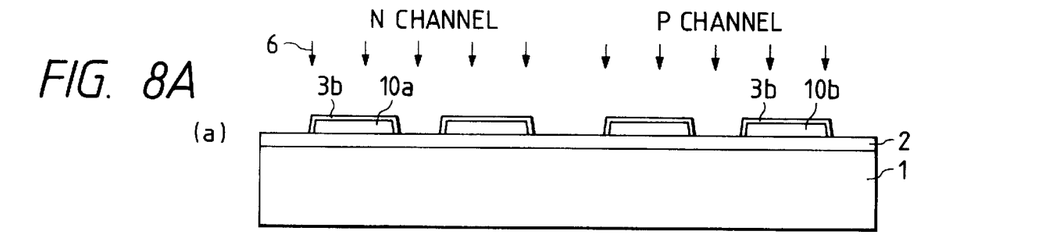
FIGS. 8A through 8D are diagrams for explaining a method of manufacturing a normal stagger type CMOS TFT according to the present invention.

In the process (a) shown in FIG. 8A, a boron ion beam 6 is irradiated over the entire surface of the substrate to form a shallow source-drain layer 3b.

Figure 8B:
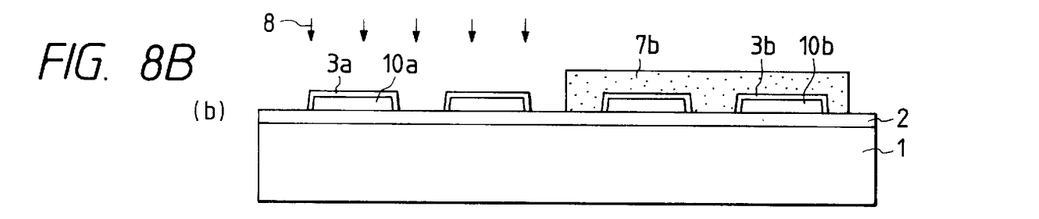

In process (b) as shown in FIG. 8B, a resist doping mask 7b is formed on a TFT on the p channel side and a phosphorus ion beam 8 is irradiated onto a TFT on the n channel side to form a source-drain layer 3a.

Figure 8C:
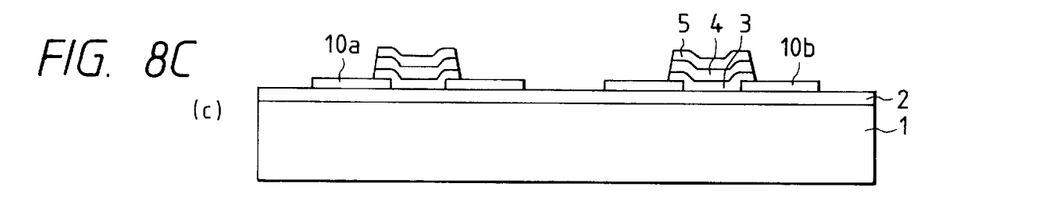

In the process (c) shown in FIG. 8C, the active layer silicon films 3, the gate insulation films 4 and the gate electrodes 5 are formed.

Figure 8D:
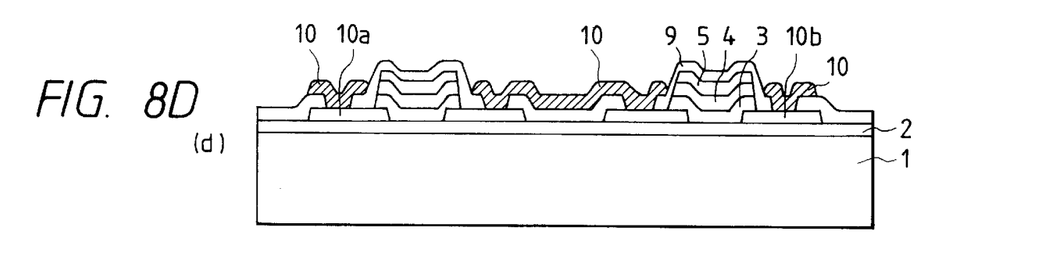

In the process (d) shown in FIG. 8D, the protective insulation films 9 and the source-drain electrodes 10 are formed, thereby, an inverter constituting a base unit of the circuit element is completed.

According to the present invention, the doping process for manufacturing the CMOS TFTs can be realized in a single masking operation.

What is claimed is:

1. A method of manufacturing a CMOS thin film semiconductor device comprising the steps of:

forming source and drain regions on a substrate;

doping the source and drain regions into a first conductivity type by an ion doping method, the acceleration voltage for the ions being selected in a range from 0.5 KeV to 3 KeV; and compensating a part of the doped source and drain-regions of first conductivity type with a dopant of second conductivity type, thereby inverting the conductivity type of the compensated part, and further comprising a step of reducing the doping density of the doped source and drain regions of first conductivity type prior to said step of compensating with the dopant of second conductivity type and thereby inverting the conductivity type of the compensated part.

2. A method of manufacturing a CMOS thin film semiconductor device according to claim 1, wherein, when performing said compensating and inverting step, a resist type doping mask is used.

3. A method of manufacturing a CMOS thin film semiconductor device according to claim 1, wherein said doping step is performed to dope ions into the source and drain regions such that only a partial thickness of the source and drain regions is doped with the ions.

4. A method of manufacturing a CMOS thin film semiconductor device according to claim 3, wherein said partial thickness extends from a surface of the source and drain regions into which the ions are doped.

5. A method of manufacturing a CMOS thin film semiconductor device according to claim 1, comprising the further step of including an active silicon layer extending between the source and drain regions so as to form an active region of a field-effect transistor.

6. A method of manufacturing a CMOS thin film semiconductor device according to claim 1, wherein said step of reducing the doping density is performed by a reactive ion ashing.

7. A method of manufacturing a CMOS thin film semiconductor device according to claim 1, wherein in the step of reducing the doping density, a part of the source and drain regions of the first conductivity type, other than the part which becomes the compensated part, is covered with a mask, and said mask is retained during the step of reducing the doping density.

8. A method of manufacturing a CMOS thin film semiconductor device according to claim 7, wherein, in the compensating step, said mask is retained as a mask against introduction of the dopant of second conductivity type thereunder.

9. A method of manufacturing a CMOS thin film semiconductor device according to claim 1, wherein, in the step of reducing the doping density, said part of the doped source and drain regions is not covered with a mask, and another part of the doped source and drain regions, other than said part, is covered with a mask.

10. A method of manufacturing a CMOS thin film semiconductor device comprising the steps of:

(a) forming a plurality of source and drain regions on a substrate;

(b) doping the plurality of source and drain regions, with a dopant of first conductivity type, into first conductivity type by an ion doping method, the acceleration voltage for the ions being selected in a range from 0.5 KeV to 3 KeV;

(c) covering one of the source and drain regions doped into first conductivity type with a doping mask;

(d) reducing the doping density of another of the source and drain regions doped into first conductivity type; and (e) further doping the other of the source and drain regions, of which doping density has been reduced, with a dopant of second conductivity type for compensating and inverting the conductivity type thereof.

11. A method of manufacturing a CMOS thin film semiconductor device according to claim 10, wherein in said step (d), at least the surface doping density of the other of the source and drain regions doped into first conductivity type is reduced.

12. A method of manufacturing a CMOS thin film semiconductor device according to claim 10, wherein said doping mask is retained during the steps (d) and (e).

13. A method of manufacturing a CMOS thin film semiconductor device according to claim 10, wherein said doping mask is retained during the step (d).

* * * * *